United States Patent [19]
Hashimoto

[11] Patent Number: 5,272,670
[45] Date of Patent: Dec. 21, 1993

[54] SENSE AMPLIFIER FOR SEMICONDUCTOR MEMORY DEVICE

[75] Inventor: Yoshinori Hashimoto, Nara, Japan

[73] Assignee: Sharp Kabushiki Kaisha, Osaka, Japan

[21] Appl. No.: 725,786

[22] Filed: Jul. 8, 1991

[30] Foreign Application Priority Data

Jul. 10, 1990 [JP] Japan ................... 2-184961

[51] Int. Cl.⁵ .................. H03F 3/45; H03K 19/21; G11C 7/02
[52] U.S. Cl. ................... 365/195; 365/189.07; 365/203; 365/205; 365/207; 365/208; 307/471; 307/530
[58] Field of Search ............ 365/190, 205, 207–208, 365/195, 189.07, 203; 307/530, 471

[56] References Cited

U.S. PATENT DOCUMENTS 4,810,910  3/1989  Schoellikopf ............. 307/530
5,091,879  2/1992  Tran ....................... 307/530

Primary Examiner—Margaret R. Wambach
Attorney, Agent, or Firm—Nixon & Vanderhye

[57] ABSTRACT

In a sense amplifier connected to a bit line pair of a semiconductor memory device, a control gate is connected between an amplifying circuit and a transistor for activating the amplifying circuit. The control gate closes only when either of the bit lines is HIGH. When both the bit line are HIGH or LOW, the amplifying circuit does not operate.

13 Claims, 2 Drawing Sheets

FIG. 3
PRIOR ART
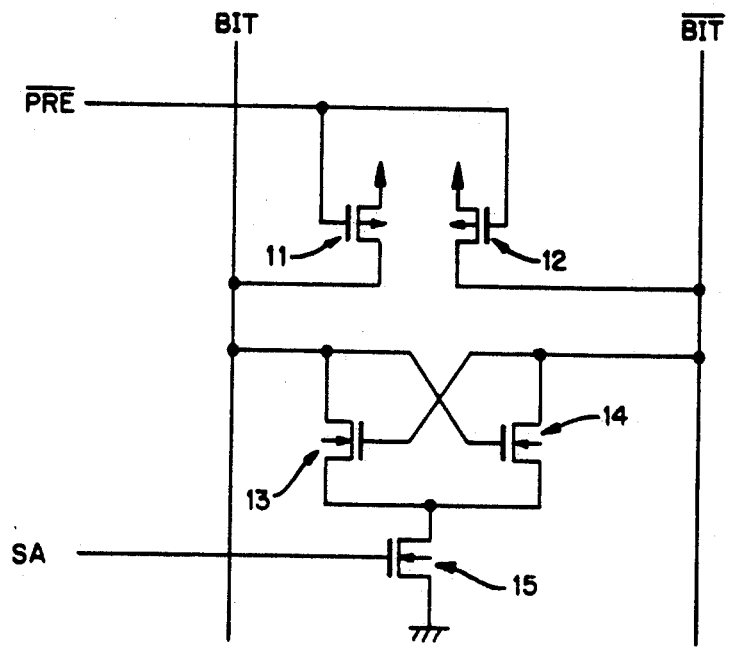
FIG. 4A
PRIOR ART
FIG. 4B
PRIOR ART
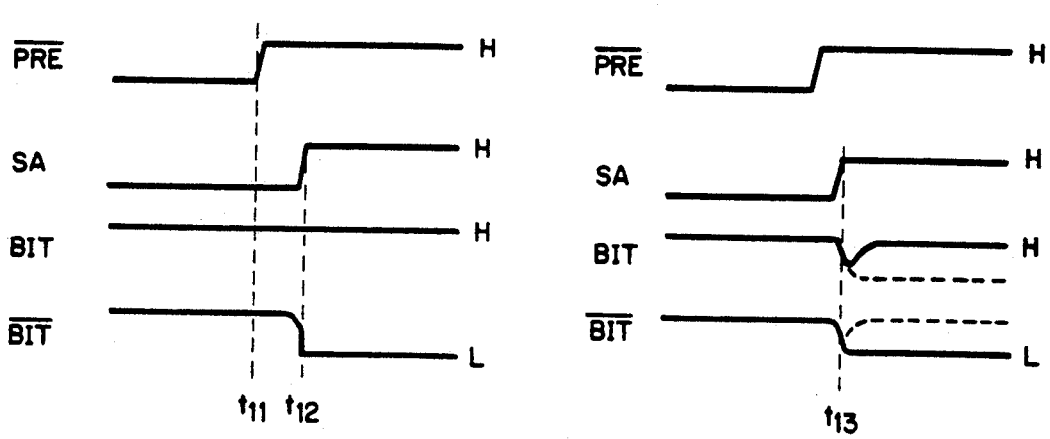

SENSE AMPLIFIER FOR SEMICONDUCTOR MEMORY DEVICE

BACKGROUND OF THE INVENTION

1. Field of the Invention

This invention relates to a sense amplifier, and more particularly to a sense amplifier which is useful in a CMOS semiconductor integrated circuit used in a one-chip microcomputer, a microprocessor or a memory.

2. Description of the Prior Art

FIG. 3 shows a prior art sense amplifier used in a semiconductor memory device. The sense amplifier of FIG. 3 comprises PMOS precharging transistors 11 and 12, NMOS amplifying transistors 13 and 14, and an NMOS driving transistor 15. A precharge signal $\overline{PRE}$ (active-low) is supplied to the gates of the precharging transistors 11 and 12. The precharging transistors 11 and 12 are connected to bit lines BIT and $\overline{BIT}$ which are connected to memory cells (not shown), respectively. Hereinafter, signals appearing on the bit lines BIT and $\overline{BIT}$ are referred to as "BIT" and "$\overline{BIT}$", respectively. To the gate of the driving transistor 15, a sense amplifier drive signal SA is supplied. The timings of the signals $\overline{PRE}$ and SA are so controlled that they will not become active at the same time.

When the signals BIT, $\overline{BIT}$ and SA are adequately controlled by an external circuit (not shown), the sense amplifier of FIG. 3 operates according to the operation timing shown in FIG. 4A. The operation of the sense amplifier will be described by illustrating the reading operation in which data is read out from one of the memory cells. First, the precharge signal $\overline{PRE}$ is set LOW to turn on the transistors 11 and 12, so that both the signals BIT and $\overline{BIT}$ are HIGH. At this time, the sense amplifier drive signal SA remains LOW, and the amplifying transistors 13 and 14 do not operate. The precharge signal $\overline{PRE}$ becomes HIGH at time $t_{11}$, and the levels of the signals BIT and $\overline{BIT}$ change depending upon the data read out from the memory cell (in FIG. 4A, the level of the signal $\overline{BIT}$ becomes lower). Then, the sense amplifier drive signal SA is made HIGH at $t_{12}$ to turn on the transistor 15, whereby the amplifying transistors 13 and 14 start the sense amplification of the potential difference between the signals BIT and $\overline{BIT}$.

The above-mentioned prior art sense amplifier requires the provision of an external circuit which controls the timings of the signals BIT, $\overline{BIT}$ and SA. Furthermore, the sense amplifier has a problem in that, when the external circuit fails to adequately control the timings of the signals BIT, $\overline{BIT}$ and SA, the sense amplifier malfunctions as described below. For example, when the level of the signal SA is erroneously raised at time $t_{13}$ (FIG. 4B) while both the signals BIT and $\overline{BIT}$ remain HIGH, the levels of both the signals BIT and $\overline{BIT}$ are pulled down. If the potential of the bit line BIT (which should be higher) is pulled down to a lower level than that of the bit line $\overline{BIT}$ (which should be lower), the potential relationship between the signals BIT and $\overline{BIT}$ becomes opposite to that they should have, as shown by broken lines in FIG. 4B.

SUMMARY OF THE INVENTION

The sense amplifier of this invention, which overcomes the above-discussed and numerous other disadvantages and deficiencies of the prior art, comprises: sense amplifying means connected to a pair of first and second bit lines; first switching means, one terminal of said first switching means connected to said sense amplifying means, said first switching means comprising two control terminals which are connected to said first and second bit lines, respectively, said first switching means closing when said first and second bit lines have a predetermined potential relationship; and second switching means, connected between said first switching means and a predetermined potential level, for closing when a control signal is active.

According to the invention, the first switch means closes only when the potentials of the first and second bit lines have the predetermined relationship (in a preferred embodiment, either of the bit lines is HIGH), so as to connect the sense amplifying means with the second switching means. Therefore, it is assured that the sense amplifying means begins to operate after the predetermined potential relationship between the bit lines is satisfied, without using an external control circuit.

In a preferred embodiment, said sense amplifier further comprises precharging means for precharging said first and second bit lines.

In a preferred embodiment, said predetermined potential relationship is that the potential of said first bit line is one of the HIGH and LOW levels and the potential of said second bit line is the other of the HIGH and LOW levels.

In a preferred embodiment, said first switching means comprises a transistor, and a logic circuit, inputs of said logic circuit being said two control terminals, an output of said logic circuit connected to the gate of said transistor.

Preferably, said logic circuit is an exclusive OR circuit or a NAND circuit.

In a preferred embodiment, said second switching means is a transistor, and said control signal is coupled to the gate of said transistor.

In a preferred embodiment, said predetermined potential level is the ground level.

In a preferred embodiment, said sense amplifying means comprises first and second transistors, said first transistor connected between said first bit line and said first switching means, said second transistor connected between said second bit line and said first switching means, the gate of said first transistor connected to said second bit line, the gate of said second transistor connected to said first bit line.

Thus, the invention described herein makes possible the objectives:

(1) providing a sense amplifier which does not require the provision of an external circuit for controlling the timings of the signals BIT, $\overline{BIT}$ and SA;

(2) providing a sense amplifier in which the timings of the signals BIT, $\overline{BIT}$ and SA can be correctly controlled; and (3) providing a sense amplifier in which the timings of the signals BIT, $\overline{BIT}$ and SA can be controlled using the potentials of the bit lines.

BRIEF DESCRIPTION OF THE DRAWINGS

This invention may be better understood and its numerous objects and advantages will become apparent to those skilled in the art by reference to the accompanying drawings as follows:

FIG. 3 is a circuit diagram illustrating a sense amplifier of the prior art.

FIG. 4A is a timing chart illustrating the operation of the sense amplifier of FIG. 3.

FIG. 4B is a timing chart illustrating the operation of the sense amplifier of FIG. 3 in a malfunction condition.

DESCRIPTION OF THE PREFERRED EMBODIMENTS

Figure 1:
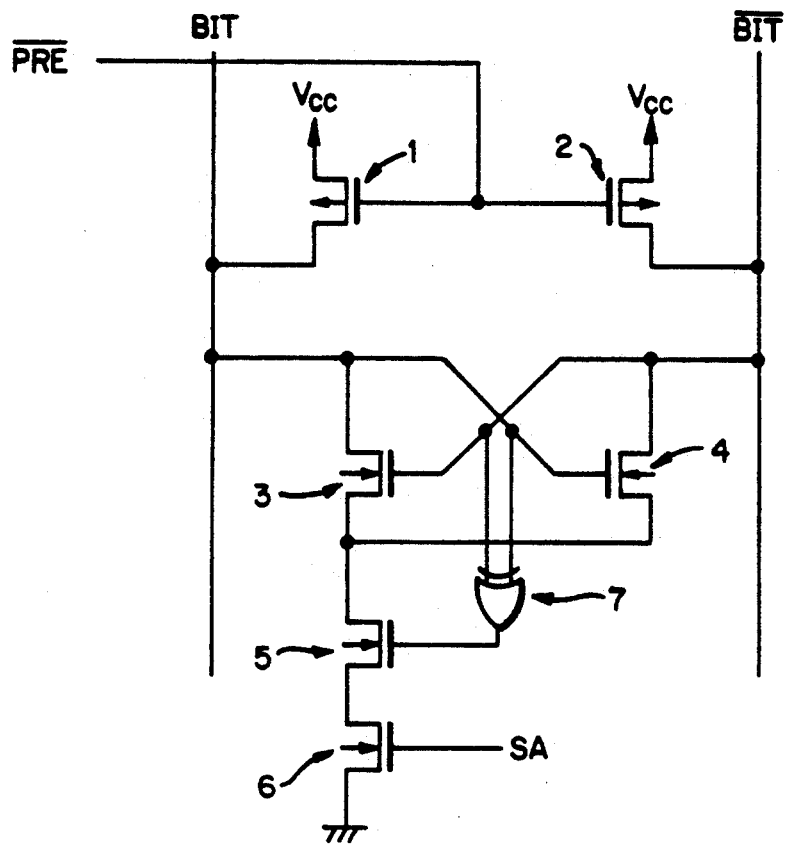
FIG. 1 is a circuit diagram illustrating an embodiment of the invention.

FIG. 1 illustrates a sense amplifier according to the invention. The sense amplifier of FIG. 1 is connected to memory cells of semiconductor memory device through a pair of bit lines BIT and $\overline{\text{BIT}}$, and comprises PMOS precharging transistors 1 and 2, NMOS amplifying transistors 3 and 4, an NMOS control transistor 5, and an NMOS driving transistor 6. The precharging transistor 1 is connected between the bit line BIT and a power source ($V_{cc}$), and the other precharging transistor 2 is connected between the other bit line $\overline{\text{BIT}}$ and the power source. The bit lines BIT and $\overline{\text{BIT}}$ constitute a bit line pair. The gates of the precharging transistors 1 and 2 are connected to a precharge signal line $\overline{\text{PRE}}$. The amplifying transistor 3 is connected between the bit line BIT and the control transistor 5, and the amplifying transistor 4 is connected between the bit line $\overline{\text{BIT}}$ and the control transistor 5. The gates of the amplifying transistors 3 and 4 are connected to the bit lines $\overline{\text{BIT}}$ and BIT, respectively.

The sense amplifier of FIG. 1 further comprises a two-input exclusive OR circuit 7. The two inputs of the exclusive OR circuit 7 are connected to the bit lines BIT and $\overline{\text{BIT}}$, respectively, and the output of the exclusive OR circuit 7 to the gate of the control transistor 5. The output of the exclusive OR circuit 7 is HIGH only when one of the signals BIT and $\overline{\text{BIT}}$ is LOW. The driving transistor 6 is connected between the ground and the control transistor 5, and a drive signal line SA is connected to the gate of the driving transistor 6.

Figure 2:
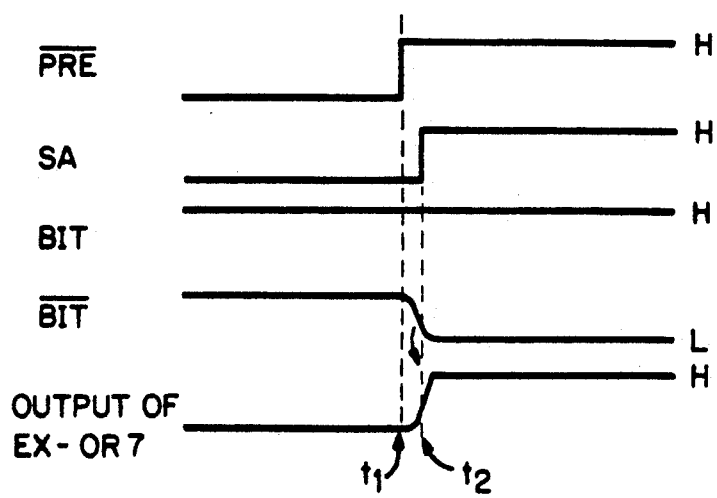
FIG. 2 is a timing chart illustrating the operation of the embodiment of FIG. 1.

The operation of the sense amplifier of FIG. 1 will be described with reference to FIG. 2. First, a precharge signal $\overline{\text{PRE}}$ on the precharge signal line $\overline{\text{PRE}}$ is LOW to turn on the precharging transistors 1 and 2, thereby precharging the bit lines BIT and $\overline{\text{BIT}}$. Both the levels of the signals BIT and $\overline{\text{BIT}}$ on the bit lines are HIGH. Then, the precharge signal $\overline{\text{PRE}}$ is raised at time $t_1$ to cease the precharge operation. Thereafter, the sense amplifier drive signal SA is raised at time $t_2$, so that the driving transistor 6 turns on.

When either of the signals BIT and $\overline{\text{BIT}}$ becomes LOW depending upon the data to be read out, the output of the exclusive OR circuit 7 is made HIGH so that the control transistor 5 turns on or become conductive. As a result, the amplifying transistors 3 and 4 are grounded through the transistors 5 and 6 to perform the differential amplification of the signals BIT and $\overline{\text{BIT}}$.

In contrast, when both the signals BIT and $\overline{\text{BIT}}$ are HIGH, the output of the exclusive OR circuit 7 is LOW so that the control transistor 5 is not conductive, thereby disabling the sense amplification of the amplifying transistors 3 and 4. This prevents malfunction from occurring in which both the signals BIT and $\overline{\text{BIT}}$ are pulled down and the potential relationship between the signals BIT and $\overline{\text{BIT}}$ becomes opposite to that it should be.

In the above-described configuration, the signals BIT and $\overline{\text{BIT}}$ do not become LOW at the same time. Therefore, a two-input NAND circuit may be used in lieu of the exclusive OR circuit 7. Such an embodiment using a NAND circuit can perform the same operation as the embodiment of FIG. 1, with a decreased number of transistors.

It is understood that various other modifications will be apparent to and can be readily made by those skilled in the art without departing from the scope and spirit of this invention. Accordingly, it is not intended that the scope of the claims appended hereto be limited to the description as set forth herein, but rather than the claims be construed as encompassing all the features of patentable novelty that reside in the present invention, including all features that would be treated as equivalents thereof by those skilled in the art to which this invention pertains.

What is claimed is:

1. A sense amplifier comprising:
   sense amplifying means connected to a pair of first and second bit lines;
   first switching means for controlling activation of said sense amplifying means, said first switching means comprising two input terminals connected to said first and second bit lines, respectively, said first switching means closing when said first and second bit lines have a predetermined potential relationship; and
   second switching means, connected to said first switching means and a predetermined potential level, for closing when a control signal is active.

2. A sense amplifier according to claim 1, wherein said sense amplifier further comprises precharging means for precharging said first and second bit lines.

3. A sense amplifier according to claim 1, wherein said predetermined potential relationship is that the potential of said first bit line is one of the HIGH and LOW levels and the potential of said second bit line is the other of the HIGH and LOW levels.

4. A sense amplifier according to claim 1, wherein said first switching means comprises a transistor, and a logic circuit, inputs of said logic circuit being said two input terminals, an output of said logic circuit connected to the gate of said transistor.

5. A sense amplifier according to claim 4, wherein said logic circuit is an exclusive OR circuit.

6. A sense amplifier according to claim 4, wherein said logic circuit is a NAND circuit.

7. A sense amplifier according to claim 1, wherein said second switching means is a transistor, and said control signal is coupled to the gate of said transistor.

8. A sense amplifier according to claim 1, wherein said predetermined potential level is the ground level.

9. A sense amplifier according to claim 1, wherein said sense amplifying means comprises first and second transistors, said first transistor connected between said first bit line and said first switching means, said second transistor connected between said second bit line and said first switching means, the gate of said first transistor connected to said second bit line, the gate of said second transistor connected to said first bit line.

10. A sense amplifier comprising:
    sense amplifying means connected to complementary first and second bit lines;
    a control circuit for enabling activation of said sense amplifying means, said control circuit comprising a first switch having two inputs connected to said bit lines, respectively, said switch being closed when said bit lines have a predetermined potential relationship; and a second switch responsive to a sense amplifier control signal, said sense amplifying means being activated by said second switch when said first switch is closed.

11. The sense amplifier of claim 10 wherein said first switch prevents said second switch from activating said sense amplifying means when said bit lines exhibit a potential relationship that is less than said predetermined potential.

12. The sense amplifier of claim 10 wherein said first switch connects said second switch to said sense amplifying means when said predetermined potential relationship is present.

13. The sense amplifier of claim 12 wherein said first switch is controlled by an output of an exclusive OR circuit connected to said bit lines.

* * * * *